United States Patent
Chang et al.

(10) Patent No.: US 9,875,972 B1
(45) Date of Patent: Jan. 23, 2018

(54) SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Shou-Zen Chang, New Taipei (TW); Chi-Ming Huang, Changhua (TW); Kai-Chiang Wu, Hsinchu (TW); Sen-Kuei Hsu, Kaohsiung (TW); Hsin-Yu Pan, Taipei (TW); Han-Ping Pu, Taichung (TW); Albert Wan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/210,067

(22) Filed: Jul. 14, 2016

(51) Int. Cl.
| | |
|---|---|
| *H01L 23/552* | (2006.01) |
| *H01L 23/538* | (2006.01) |
| *H01L 23/31* | (2006.01) |
| *H01L 25/065* | (2006.01) |
| *H01L 21/48* | (2006.01) |
| *H01L 21/56* | (2006.01) |
| *H01L 25/00* | (2006.01) |

(52) U.S. Cl.
CPC .......... *H01L 23/552* (2013.01); *H01L 21/485* (2013.01); *H01L 21/486* (2013.01); *H01L 21/4853* (2013.01); *H01L 21/4857* (2013.01); *H01L 21/565* (2013.01); *H01L 23/3114* (2013.01); *H01L 23/5382* (2013.01); *H01L 23/5383* (2013.01); *H01L 23/5384* (2013.01); *H01L 23/5386* (2013.01); *H01L 23/5389* (2013.01); *H01L 25/0657* (2013.01); *H01L 25/50* (2013.01); *H01L 2225/06537* (2013.01); *H01L 2225/06555* (2013.01)

(58) Field of Classification Search
CPC . H01L 23/5225; H01L 21/486; H01L 23/522; H01L 21/4857; H01L 23/525
USPC ........................................................ 257/659
See application file for complete search history.

(56) References Cited

U.S. PATENT DOCUMENTS

| | | | |
|---|---|---|---|
| 7,564,115 B2 | 7/2009 | Chen et al. | |
| 7,633,165 B2 | 12/2009 | Hsu et al. | |
| 7,825,024 B2 | 11/2010 | Lin et al. | |
| 7,973,413 B2 | 7/2011 | Kuo et al. | |
| 8,105,875 B1 | 1/2012 | Hu et al. | |
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |
| 8,278,152 B2 | 10/2012 | Liu et al. | |
| 8,426,961 B2 | 4/2013 | Shih et al. | |
| 8,669,174 B2 | 3/2014 | Wu et al. | |

(Continued)

*Primary Examiner* — Theresa T Doan
(74) *Attorney, Agent, or Firm* — McClure, Qualey & Rodack, LLP

(57) ABSTRACT

A semiconductor device structure is provided. The semiconductor device structure includes a first device. The semiconductor device structure includes a conductive element over the first device. The semiconductor device structure includes a first conductive shielding layer between the first device and the conductive element. The first conductive shielding layer has openings, and a maximum width of the opening is less than a wavelength of an energy generated by the first device.

20 Claims, 18 Drawing Sheets

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 2004/0245583 A1* | 12/2004 | Horiuchi ........... H01L 21/26513 257/408 |
| 2011/0201151 A1* | 8/2011 | Gambino ............ G06F 17/5068 438/107 |
| 2014/0001645 A1 | 1/2014 | Lin et al. |
| 2014/0225258 A1 | 8/2014 | Chiu et al. |
| 2014/0252572 A1 | 9/2014 | Hou et al. |
| 2015/0287697 A1 | 10/2015 | Tsai et al. |
| 2015/0348872 A1 | 12/2015 | Kuo et al. |

* cited by examiner

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, a distance between neighboring devices decreases. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
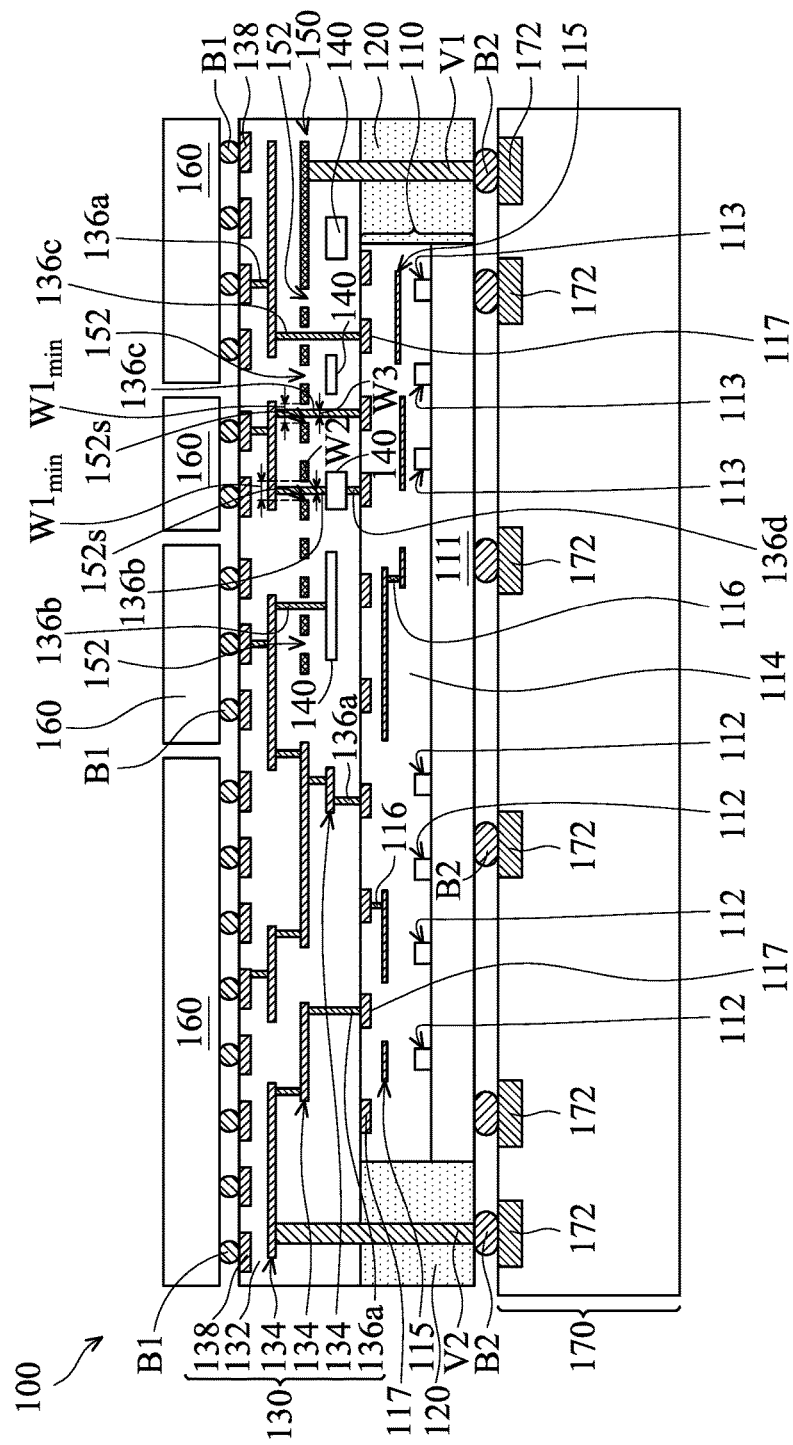
FIG. 1A is a cross-sectional view of a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1B:
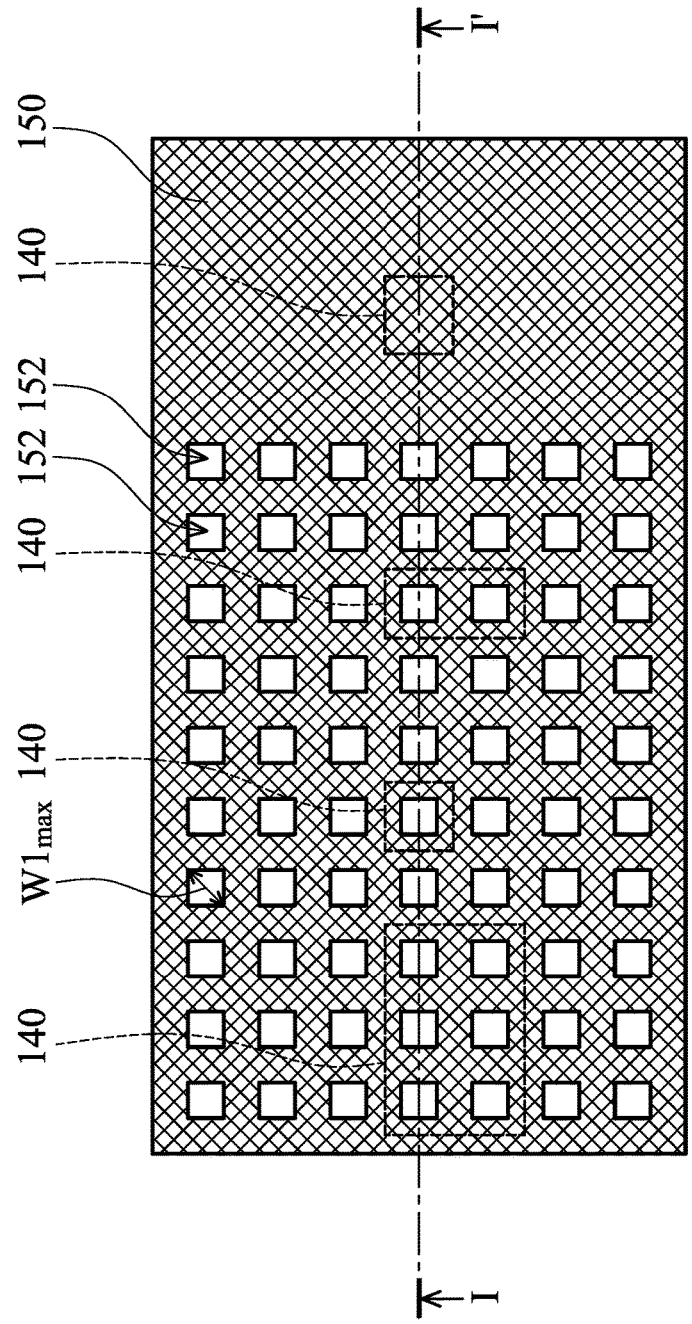
FIG. 1B is a top view of the conductive shielding layer and the devices of the semiconductor device structure of FIG. 1A, in accordance with some embodiments.
Figure 1C:
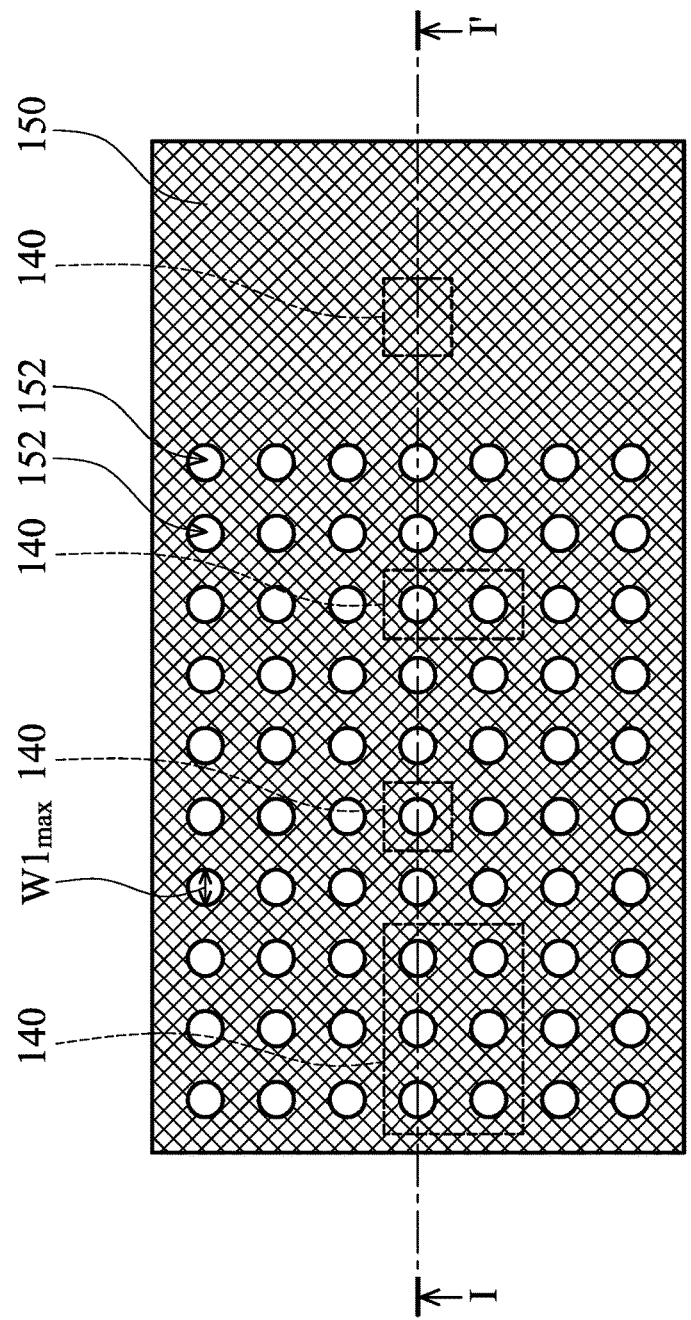
FIG. 1C is a top view of the conductive shielding layer and the devices of the semiconductor device structure of FIG. 1A, in accordance with some embodiments.

FIG. 1A is a cross-sectional view of a semiconductor device structure 100, in accordance with some embodiments. FIG. 1B is a top view of a conductive shielding layer 150 and devices 140 of the semiconductor device structure 100 of FIG. 1A, in accordance with some embodiments. FIG. 1C is a top view of the conductive shielding layer 150 and the devices 140 of the semiconductor device structure 100 of FIG. 1A, in accordance with some embodiments. FIG. 1A is a cross-sectional view illustrating the conductive shielding layer 150 and the devices 140 along a sectional line I-I' in FIG. 1B or 1C, in accordance with some embodiments.

As shown in FIG. 1A, a semiconductor device structure 100 is provided, in accordance with some embodiments. The semiconductor device structure 100 includes a chip structure 110, a molding layer 120, a wiring structure 130, devices 140, and a conductive shielding layer 150, in accordance with some embodiments. The chip structure 110 includes a chip 111, devices 112 and 113, a dielectric layer 114, wiring layers 115, conductive via structures 116, and pads 117, in accordance with some embodiments.

The chip 111 is made of a semiconductor material, such as silicon, in accordance with some embodiments. The chip 111 is made of a compound semiconductor such as silicon carbide, gallium arsenide, gallium phosphide, indium phosphide, indium arsenide, an alloy semiconductor such as SiGe, or GaAsP, or a combination thereof. In some embodiments, the chip 111 includes multi-layer semiconductors, semiconductor-on-insulator (SOI) (such as silicon-on-insulator or germanium-on-insulator), or a combination thereof.

In some embodiments, an isolation structure (not shown) is formed in the chip 111 to define various active regions in the chip 111, and to electrically isolate neighboring devices (e.g. transistors) from one another, in accordance with some embodiments. The isolation structure includes a dielectric material, such as silicon oxide, silicon nitride, silicon oxynitride, fluoride-doped silicate glass (FSG), a low-K dielectric material, another suitable material, or a combination thereof, in accordance with some embodiments. The isolation structure is formed by using an isolation technology, such as local oxidation of semiconductor (LOCOS), shallow trench isolation (STI), or the like, in accordance with some embodiments.

In some embodiments, doped regions (not shown) are formed in the active regions of the chip 111. The devices 112 and 113 are formed over, on, or in the chip 111, in accordance with some embodiments. The devices 112 and 113 include transistors, inductors, filters, power amplifiers (PA), phase-locked loops, capacitors, resistors, or another suitable device.

The devices 113 include radio frequency devices, in accordance with some embodiments. The devices 113 generate radio frequency energy, in accordance with some embodiments. The radio frequency energy has a radio frequency and a wavelength, in accordance with some embodiments. The radio frequency ranges from about 300 MHz to about 300 GHz, in accordance with some embodiments.

The dielectric layer 114 is formed over the chip 111, in accordance with some embodiments. The devices 112 and 113 are formed in or under the dielectric layer 114, in accordance with some embodiments. The wiring layers 115 and the conductive via structures 116 are formed in the dielectric layer 114, in accordance with some embodiments.

The pads 117 are formed over the dielectric layer 114, in accordance with some embodiments. The conductive via structures 116 are between and connected to the wiring layers 115 or between and connected to the pads 117 and the wiring layers 115 thereunder, in accordance with some embodiments.

The molding layer 120 surrounds the chip structure 110, in accordance with some embodiments. The molding layer 120 includes a polymer material or another suitable insulating material. The wiring structure 130 is formed over the chip structure 110 and the molding layer 120, in accordance with some embodiments. The wiring structure 130 includes an insulating layer 132, wiring layers 134, conductive via structures 136a, 136b, 136c, and 136d, and pads 138, in accordance with some embodiments.

The wiring layers 134 and the conductive via structures 136a, 136b, 136c, and 136d are formed in the insulating layer 132, in accordance with some embodiments. The pads 138 are formed over the insulating layer 132, in accordance with some embodiments. The conductive via structures 136a are between and electrically connected to the wiring layers 134 and the pads 138 and 117, in accordance with some embodiments.

The conductive via structures 136b are between and electrically connected to the wiring layers 134 and the devices 140, in accordance with some embodiments. The conductive via structures 136c are between and electrically connected to the wiring layers 134 and the pads 117, in accordance with some embodiments. The conductive via structures 136d are between and electrically connected to the devices 140 and the pads 117, in accordance with some embodiments.

The devices 140 are formed in the insulating layer 132, in accordance with some embodiments. The devices 140 include inductors, filters, power amplifiers (PA), phase-locked loops, capacitors, resistors, chips, or another suitable device. The devices 140 include radio frequency devices, in accordance with some embodiments.

The devices 140 generate radio frequency energy, in accordance with some embodiments. The radio frequency energy has a radio frequency and a wavelength, in accordance with some embodiments. The radio frequency ranges from about 300 MHz to about 300 GHz, in accordance with some embodiments.

The conductive shielding layer 150 is formed in the insulating layer 132, in accordance with some embodiments. The conductive shielding layer 150 is positioned over the devices 140, in accordance with some embodiments. The conductive shielding layer 150 is electrically isolated from the devices 140, in accordance with some embodiments.

As shown in FIGS. 1A and 1B, the conductive shielding layer 150 has openings 152, in accordance with some embodiments. In some embodiments, a maximum width $W1_{max}$ of the openings 152 over the devices 140 and 113 is less than the wavelength (or the minimum wavelength) of the energy generated by the devices 140 and 113. The conductive shielding layer 150 is positioned between the wiring layers 134 and the devices 140 and 113, in accordance with some embodiments.

Therefore, the conductive shielding layer 150 reduces or eliminates coupling and interference from the devices 140 and 113 to the conductive elements thereover (e.g. the wiring layers 134, the conductive via structures 136a, and the pads 138), in accordance with some embodiments. Therefore, the performance of the semiconductor device structure 100 is improved, in accordance with some embodiments.

The conductive via structures 136b and 136c pass through the openings 152 respectively, in accordance with some embodiments. In some embodiments, a minimum width $W1_{min}$ of the opening 152 is greater than a width W2 of the conductive via structure 136b, and the opening 152 is passed through by the conductive via structure 136b. The conductive via structure 136b is spaced apart from inner walls 152s of the conductive shielding layer 150 that defines the opening 152, which is passed through by the conductive via structure 136b, in accordance with some embodiments.

Similarly, the minimum width $W1_{min}$ of the opening 152 is greater than a width W3 of the conductive via structure 136c, and the opening 152 is passed through by the conductive via structure 136c. The conductive via structure 136c is spaced apart from inner walls 152s of the conductive shielding layer 150 that defines the opening 152, which is passed through by the conductive via structure 136c, in accordance with some embodiments.

The openings 152 have a rectangular shape (as shown in FIG. 1B), a circular shape (as shown in FIG. 1C), or another suitable shape. The openings 152 are arranged in an array, in accordance with some embodiments. In some embodiments, the openings 152 are arranged randomly (not shown).

The openings 152 have substantially a same size, such as a same width, in accordance with some embodiments. In some other embodiments, the openings 152 have different sizes, such as different widths. The conductive shielding layer 150 includes a conductive material, such as a metal material (e.g. copper, gold, or aluminum), in accordance with some embodiments.

The conductive shielding layer 150 and the wiring layer 134 laterally adjacent thereto are formed by patterning the same conductive layer or performing the same damascene process, in accordance with some embodiments. Therefore, the conductive shielding layer 150 and the wiring layer 134 laterally adjacent thereto are made of the same material, in accordance with some embodiments.

As shown in FIG. 1A, the semiconductor device structure 100 further includes chip packages 160, in accordance with some embodiments. The chip packages 160 are disposed over the wiring structure 130, in accordance with some embodiments. Each of the chip packages 160 includes one or more chips (not shown), in accordance with some embodiments.

The chip packages 160 further include a molding layer surrounding the chip(s), in accordance with some embodiments. The chip(s) of the chip packages 160 are electrically connected to the pads 138 through conductive bumps B, in accordance with some embodiments. The conductive bumps B are between the chip packages 160 and the pads 138, in accordance with some embodiments.

The conductive shielding layer 150 reduces or eliminates coupling and interference from the devices 140 and 113 to the conductive elements thereover (e.g. the chip packages 160, the wiring layers 134, the conductive via structures 136a, the pads 138, and the conductive bumps B1), in accordance with some embodiments.

As shown in FIG. 1A, the semiconductor device structure 100 further includes a carrier substrate 170, in accordance with some embodiments. The carrier substrate 170 includes pads 172, one or more wiring layers, and conductive via structures (not shown), in accordance with some embodiments.

The wiring layers are electrically connected to the pads 172 through the conductive via structures therebetween, in accordance with some embodiments. The chip structure 110 is electrically connected to the pads 172 through conductive bumps B2 therebetween, in accordance with some embodiments.

The conductive shielding layer 150 is grounded, in accordance with some embodiments. In some embodiments, the conductive shielding layer 150 is electrically connected to the pad 172, which is grounded, through a conductive via structure V1 and the conductive bump B2 therebetween. The conductive via structure V1 passes through the molding layer 120 and extends into the insulating layer 132 to be connected to the conductive shielding layer 150, in accordance with some embodiments.

In some embodiments, the wiring layer 134 is electrically connected to the pad 172 through a conductive via structure V2 and the conductive bump B2 therebetween. The conductive via structure V2 passes through the molding layer 120 and extends into the insulating layer 132 to be connected to the wiring layer 134, in accordance with some embodiments.

Figure 2A:
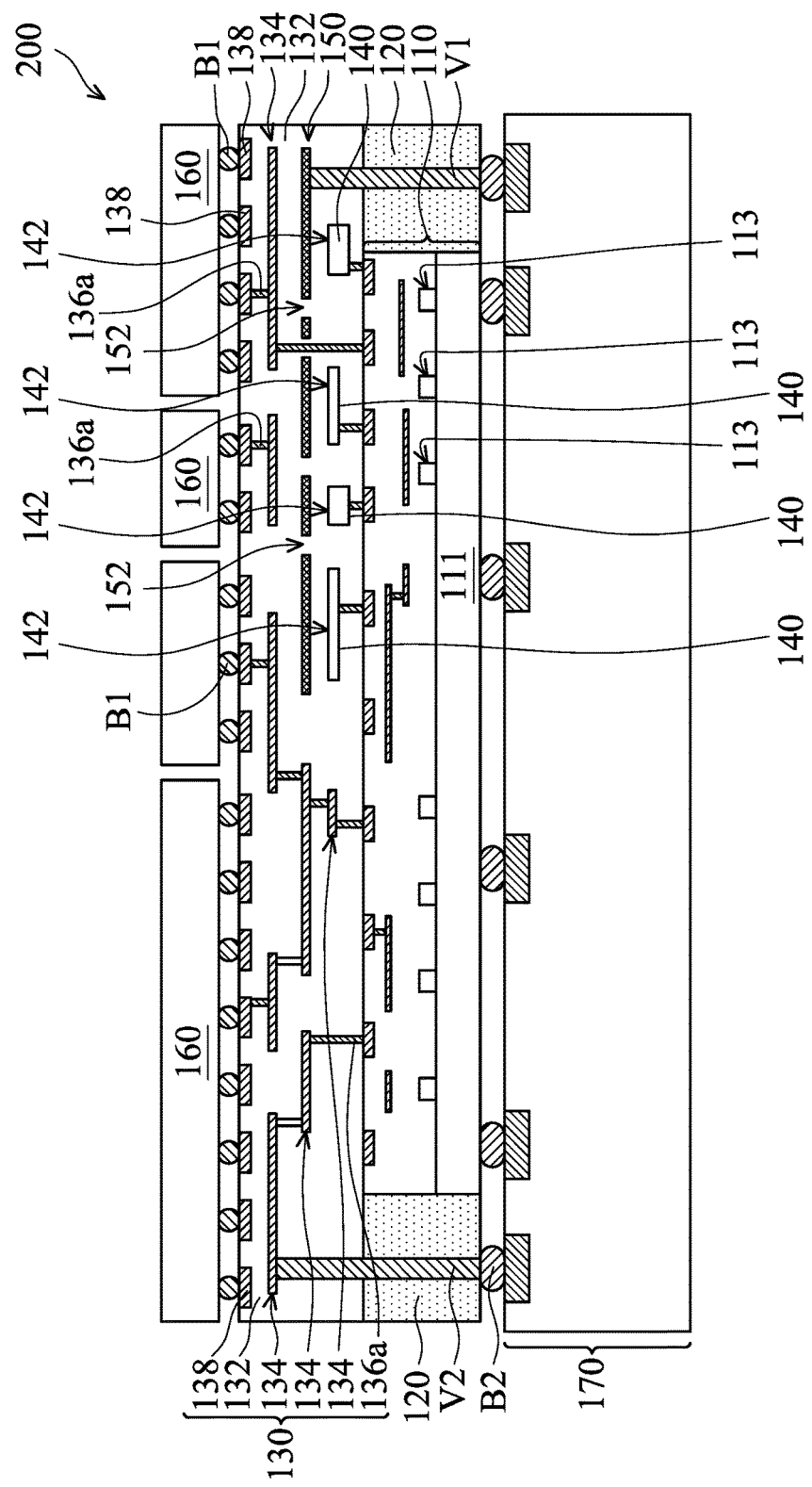
FIG. 2A is a cross-sectional view of a semiconductor device structure, in accordance with some embodiments.
Figure 2B:
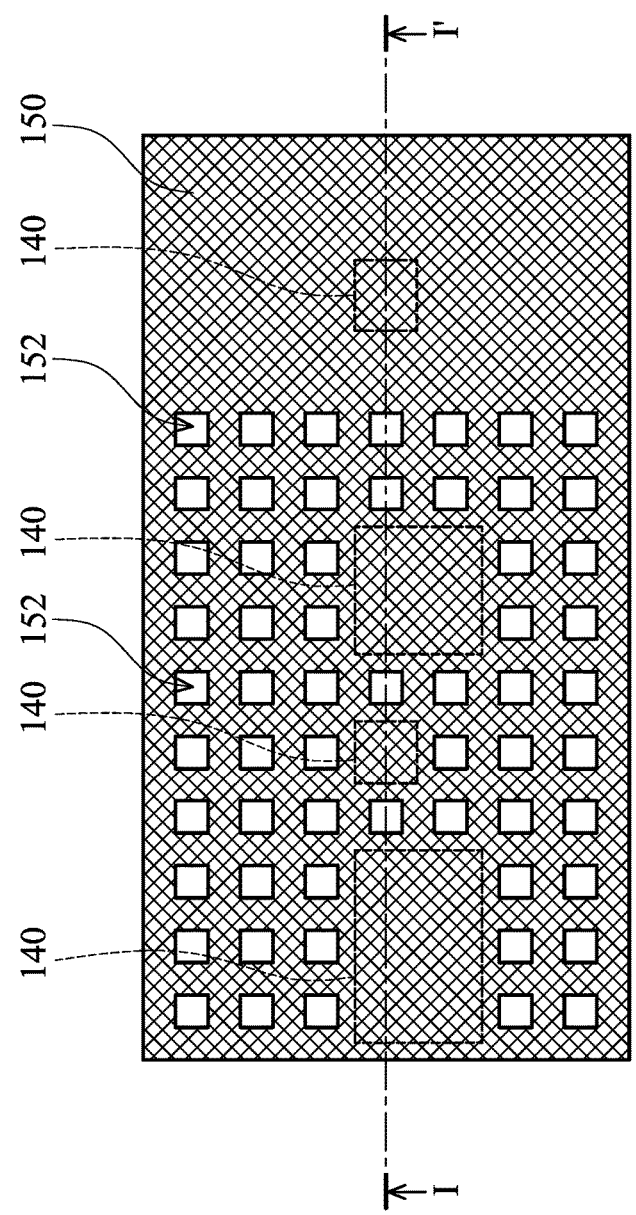
FIG. 2B is a top view of the conductive shielding layer and the devices of the semiconductor device structure of FIG. 2A, in accordance with some embodiments.

FIG. 2A is a cross-sectional view of a semiconductor device structure 200, in accordance with some embodiments. FIG. 2B is a top view of the conductive shielding layer 150 and the devices 140 of the semiconductor device structure 200 of FIG. 2A, in accordance with some embodiments. FIG. 2A is a cross-sectional view illustrating the conductive shielding layer 150 and the devices 140 along a sectional line I-I' in FIG. 2B, in accordance with some embodiments.

It should be noted that the elements in FIGS. 2A-2B, which are named and labeled identically to those in FIGS. 1A-1B, are made of materials that are similar thereto. Therefore, detailed descriptions are not repeated herein.

As shown in FIGS. 2A and 2B, the semiconductor device structure 200 is similar to the semiconductor device structure 100 of FIG. 1A, except that the conductive shielding layer 150 of the semiconductor device structure 200 covers an entire top surface 142 of the device 140, in accordance with some embodiments. In some embodiments, the conductive shielding layer 150 covers the entire top surfaces 142 of the devices 140.

That is, the openings 152 of the conductive shielding layer 150 are not formed right over the devices 140, in accordance with some embodiments. Therefore, the conductive shielding layer 150 reduces or eliminates coupling and interference from the devices 140 and 113 to the conductive elements thereover (e.g. the chip packages 160, the wiring layers 134, the conductive via structures 136a, the pads 138, and the conductive bumps B1), in accordance with some embodiments.

Figure 3:
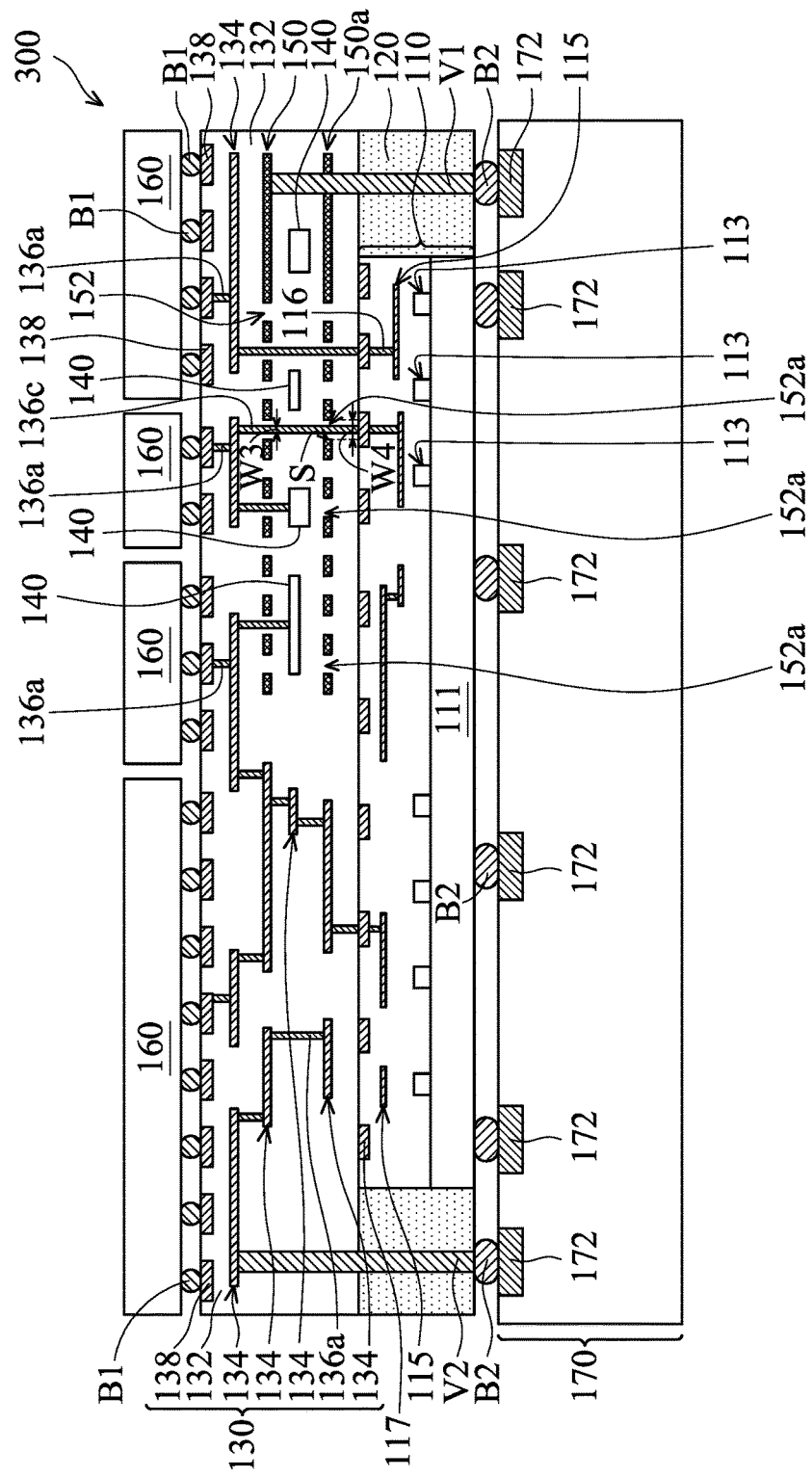
FIG. 3 is a cross-sectional view of a semiconductor device structure, in accordance with some embodiments.

FIG. 3 is a cross-sectional view of a semiconductor device structure 300, in accordance with some embodiments. It should be noted that the elements in FIG. 3, which are named and labeled identically to those in FIGS. 1A-1B, have materials and structures similar thereto. Therefore, detailed descriptions are not repeated herein.

As shown in FIG. 3, the semiconductor device structure 300 is similar to the semiconductor device structure 100 of FIG. 1A, except that the semiconductor device structure 300 further includes a conductive shielding layer 150a in the insulating layer 132, in accordance with some embodiments.

The conductive shielding layer 150a is positioned under the devices 140, in accordance with some embodiments. The devices 140 are positioned between the conductive shielding layers 150 and 150a, in accordance with some embodiments. The devices 140 are electrically isolated from the conductive shielding layers 150 and 150a, in accordance with some embodiments.

The conductive shielding layer 150a is positioned between the conductive shielding layer 150 (or the devices 140) and the chip 111, in accordance with some embodiments. The conductive shielding layer 150a has openings 152a, in accordance with some embodiments. Both the maximum width $W1_{max}$ of the opening 152 (as shown in FIG. 1B or 1C) and a maximum width of the opening 152a are less than the wavelength of the energy generated by of the devices 140 and/or 113, in accordance with some embodiments.

The minimum width W4 of the opening 152a is greater than a width W3 of the conductive via structure 136c, and the opening 152a is passed through by the conductive via structure 136c, in accordance with some embodiments. The conductive via structure 136c is spaced apart from inner walls S of the conductive shielding layer 150a that defines the opening 152a (which is passed through by the conductive via structure 136c), in accordance with some embodiments.

The conductive shielding layers 150 and 150a have the same conductive material, in accordance with some embodiments. The conductive shielding layers 150 and 150a are grounded, in accordance with some embodiments. In some embodiments, the conductive shielding layers 150 and 150a are electrically connected to the pad 172, which is grounded, through the conductive via structure V1 and the conductive bump B2. The conductive via structure V1 passes through the conductive shielding layer 150a, in accordance with some embodiments.

The conductive shielding layer 150a and the wiring layer 134 laterally adjacent thereto are formed by patterning the same conductive layer or performing the same damascene process, in accordance with some embodiments. Therefore, the conductive shielding layer 150a and the wiring layer 134 laterally adjacent thereto are made of the same material, in accordance with some embodiments.

The conductive shielding layer 150a reduces or eliminates coupling and interference from the devices 140 to the conductive elements thereunder (e.g. the chip structure 110, the carrier substrate 170, and the conductive bumps B2), in accordance with some embodiments. The conductive shielding layer 150a is between the devices 140 and 113, and therefore the conductive shielding layer 150a reduces or eliminates coupling and interference between the devices 140 and 113, in accordance with some embodiments.

Figure 4A:
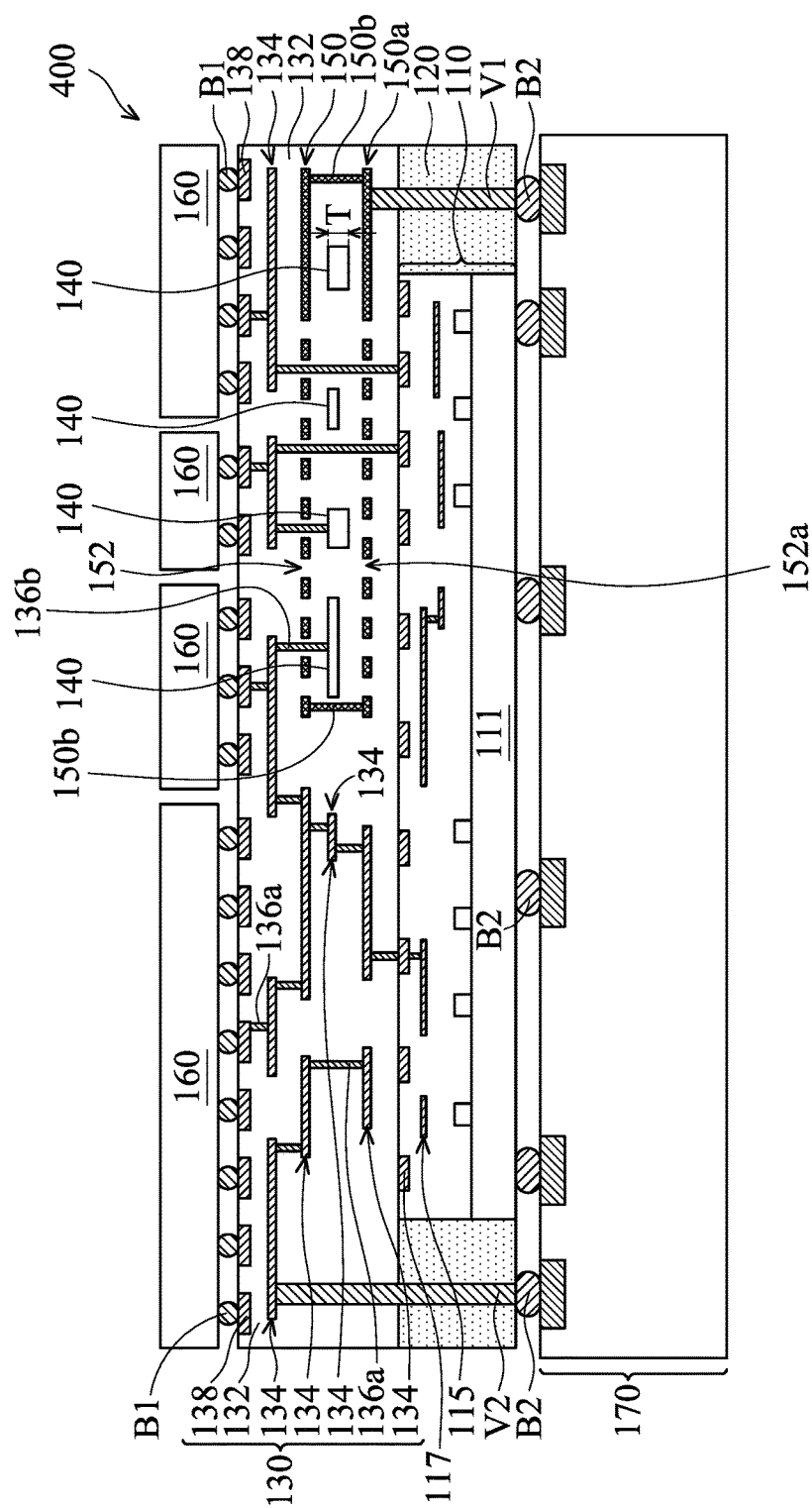
FIG. 4A is a cross-sectional view of a semiconductor device structure, in accordance with some embodiments.
Figure 4B:
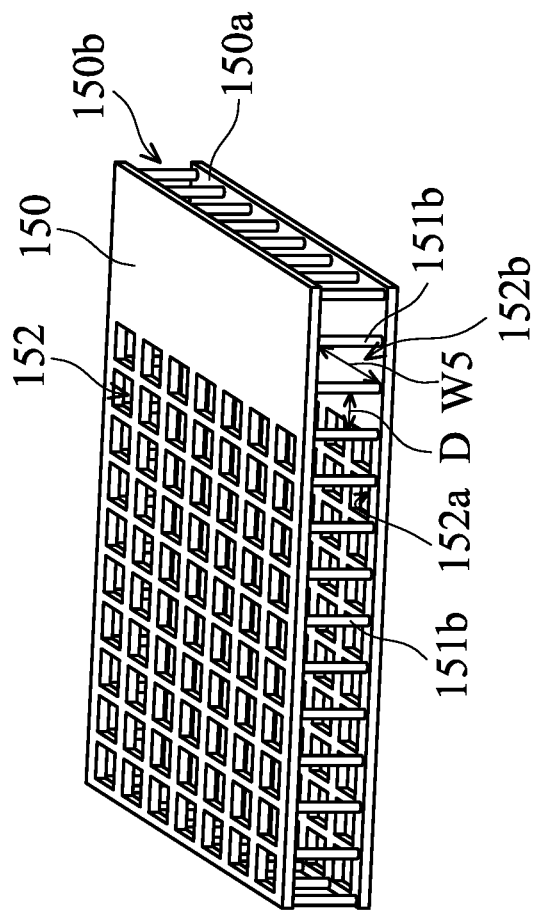
FIG. 4B is a perspective view of the conductive shielding layers and the side shielding structure of the semiconductor device structure of FIG. 4A, in accordance with some embodiments.
Figure 4C:
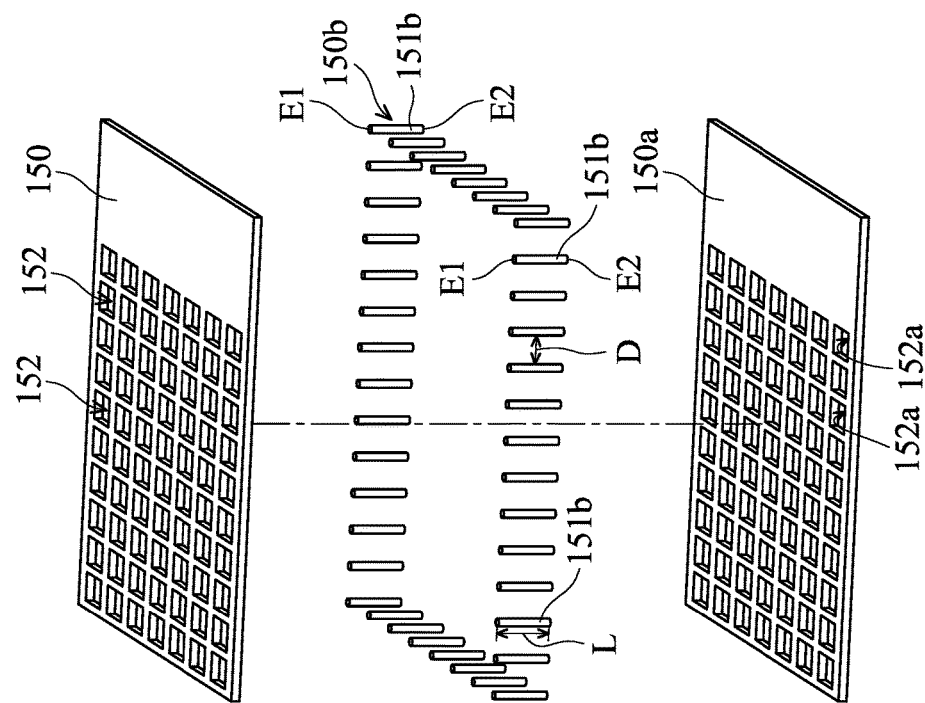
FIG. 4C is an exploded view of the conductive shielding layers and the side shielding structure of the semiconductor device structure of FIG. 4A, in accordance with some embodiments.

FIG. 4A is a cross-sectional view of a semiconductor device structure 400, in accordance with some embodiments. FIG. 4B is a perspective view of the conductive shielding layers 150 and 150a and the side shielding structure 150b of the semiconductor device structure 400 of FIG. 4A, in accordance with some embodiments. FIG. 4C is an exploded view of the conductive shielding layers 150 and 150a and the side shielding structure 150b of the semiconductor device structure 400 of FIG. 4A, in accordance with some embodiments.

Figure 4D:
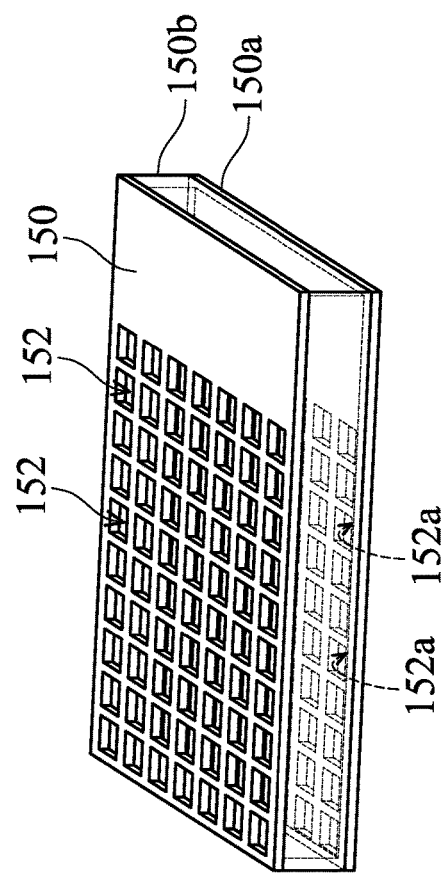
FIG. 4D is a perspective view of the conductive shielding layers and the side shielding structure of the semiconductor device structure of FIG. 4A, in accordance with some embodiments.
Figure 4E:
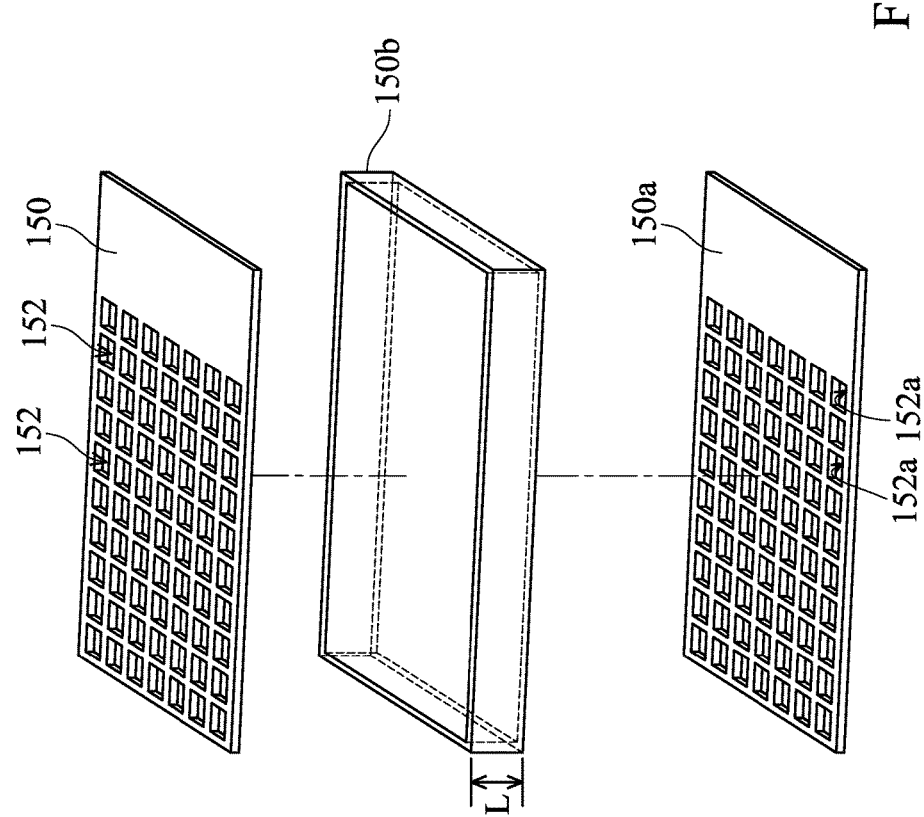
FIG. 4E is an exploded view of the conductive shielding layers and the side shielding structure of the semiconductor device structure of FIG. 4A, in accordance with some embodiments.

FIG. 4D is a perspective view of the conductive shielding layers 150 and 150a and the side shielding structure 150b of the semiconductor device structure 400 of FIG. 4A, in accordance with some embodiments. FIG. 4E is an exploded view of the conductive shielding layers 150 and 150a and the side shielding structure 150b of the semiconductor device structure 400 of FIG. 4A, in accordance with some embodiments.

It should be noted that the elements in FIGS. 4A-4E, which are named and labeled identically to those in FIGS. 1A-1B and 3, have materials and structures similar thereto. Therefore, detailed descriptions are not repeated herein.

As shown in FIGS. 4A-4C, the semiconductor device structure 400 is similar to the semiconductor device structure 300 of FIG. 3, except that the semiconductor device structure 400 further includes a side shielding structure 150b, in accordance with some embodiments. The side shielding structure 150b is between and connected to the conductive shielding layers 150 and 150a, in accordance with some embodiments. The side shielding structure 150b surrounds the devices 140, in accordance with some embodiments.

As shown in FIGS. 4B and 4C, the side shielding structure 150b includes pillars 151b, in accordance with some embodiments. The pillars 151b are spaced apart from each other, in accordance with some embodiments. The distance D between two adjacent pillars 151b is less than the wavelength of the energy generated by the devices 140, in accordance with some embodiments. The length L of each of the pillars 151b is less than the wavelength of the energy generated by the devices 140, in accordance with some embodiments.

In some embodiments, an opening 152b surrounded by two adjacent pillars 151b and the conductive shielding layers 150 and 150a is formed. In some embodiments, a maximum width W5 of the opening 152b is less than the wavelength of the energy generated by the devices 140.

Each of the pillars 151b has opposite two end portion E1 and E2, in accordance with some embodiments. The end portions E1 are connected to the conductive shielding layer 150, in accordance with some embodiments. The end portions E2 are connected to the conductive shielding layer 150a, in accordance with some embodiments.

In some other embodiments, as shown in FIGS. 4D-4E, the side shielding structure 150b includes a side wall structure continuously surrounding the entire devices 140, in accordance with some embodiments. The side shielding structure 150b is a continuous ring structure, in accordance with some embodiments. As shown in FIGS. 4A and 4E, the length L of the side shielding structure 150b is greater than the maximum thickness T of the devices 140, in accordance with some embodiments.

The side shielding structure 150b is a conductive structure, in accordance with some embodiments. The side shielding structure 150b includes a conductive material, such as a metal material (e.g. copper, gold, or aluminum), in accordance with some embodiments. The side shielding structure 150b and the conductive shielding layers 150 and 150a are made of the same material, in accordance with some embodiments. In some other embodiments, the side shielding structure 150b and the conductive shielding layers 150 and 150a are made of different materials.

The side shielding structure 150b and the conductive via structures 136a laterally adjacent thereto are formed by performing the same damascene process or patterning the same conductive layer, in accordance with some embodiments. Therefore, the side shielding structure 150b and the conductive via structures 136a laterally adjacent thereto are made of the same material, in accordance with some embodiments.

Figure 5:
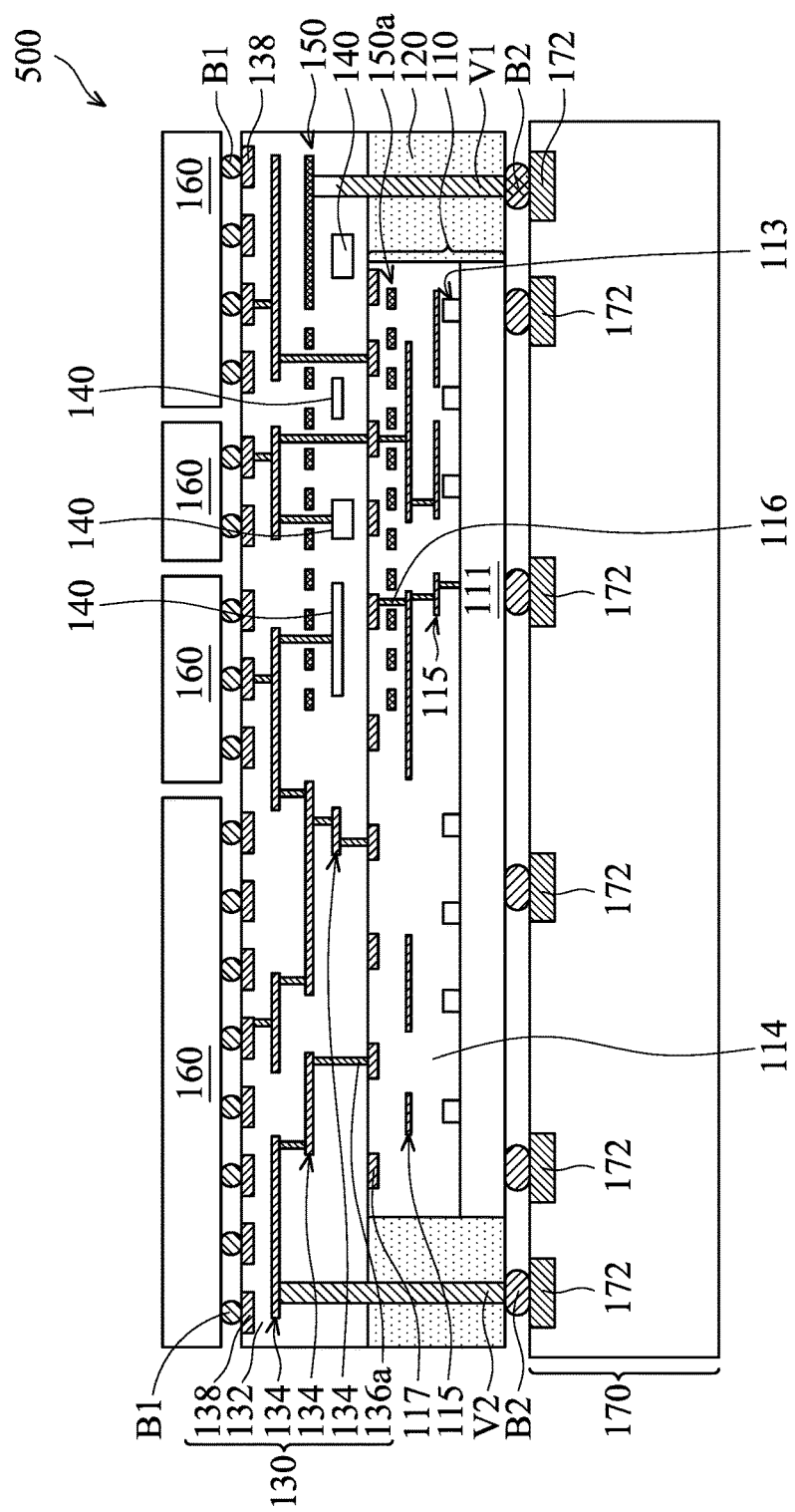
FIG. 5 is a cross-sectional view of a semiconductor device structure, in accordance with some embodiments.

FIG. 5 is a cross-sectional view of a semiconductor device structure 500, in accordance with some embodiments. It should be noted that the elements in FIG. 5, which are named and labeled identically to those in FIGS. 1A-1B and 3, have materials and structures similar thereto. Therefore, detailed descriptions are not repeated herein.

As shown in FIG. 5, the semiconductor device structure 500 is similar to the semiconductor device structure 300 of FIG. 3, except that the conductive shielding layer 150a of the semiconductor device structure 500 is in the dielectric layer 114 of the chip structure 110, in accordance with some embodiments.

Figure 6:
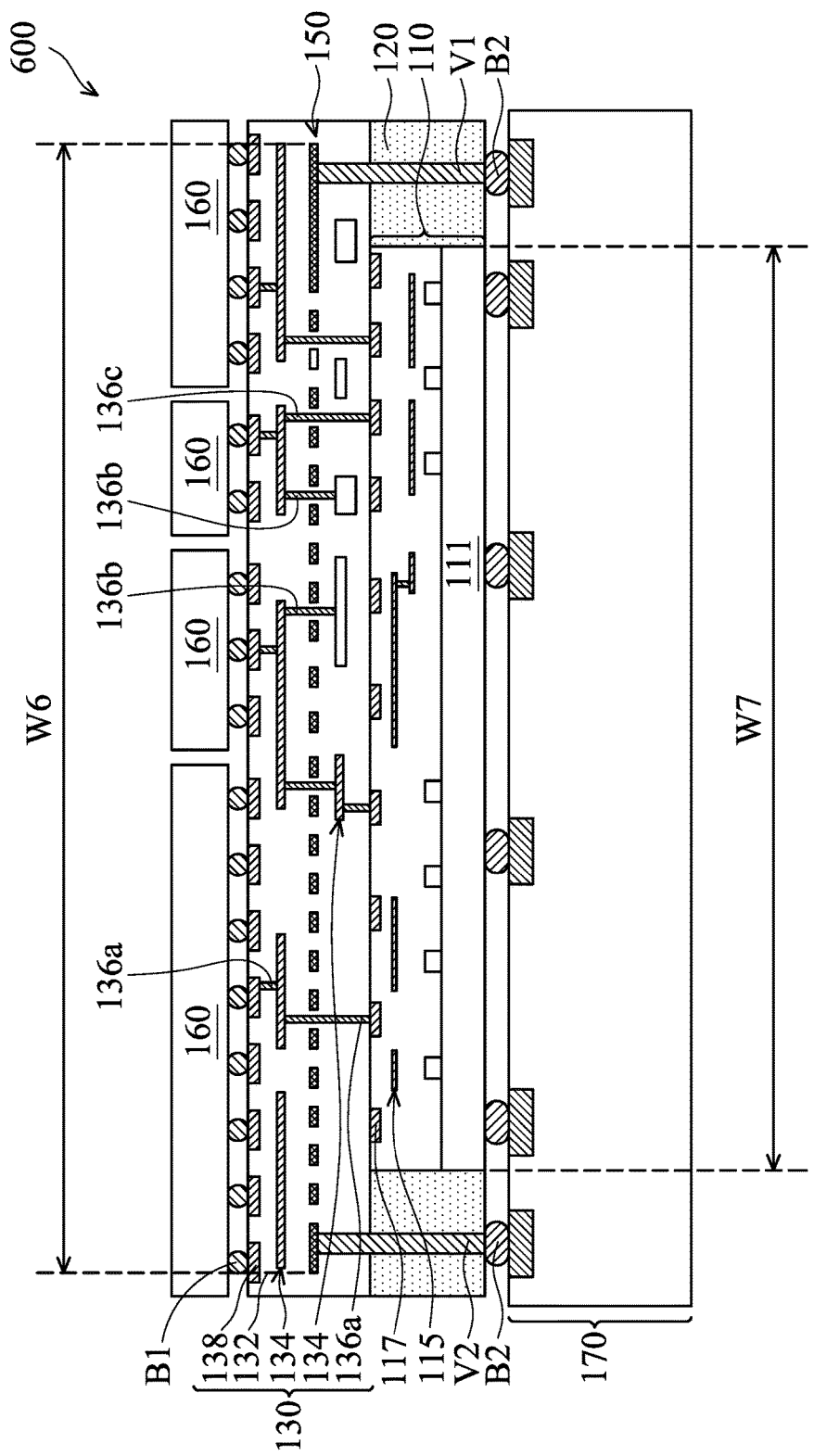
FIG. 6 is a cross-sectional view of a semiconductor device structure, in accordance with some embodiments.

FIG. 6 is a cross-sectional view of a semiconductor device structure 600, in accordance with some embodiments. It should be noted that the elements in FIG. 6, which are named and labeled identically to those in FIGS. 1A-1B, have materials and structures similar thereto. Therefore, detailed descriptions are not repeated herein.

As shown in FIG. 6, the semiconductor device structure 600 is similar to the semiconductor device structure 100 of FIG. 1A, except that the width W6 of the conductive shielding layer 150 of the semiconductor device structure 600 is greater than the width W7 of the chip structure 110 (or the chip 111), in accordance with some embodiments.

Figure 7:
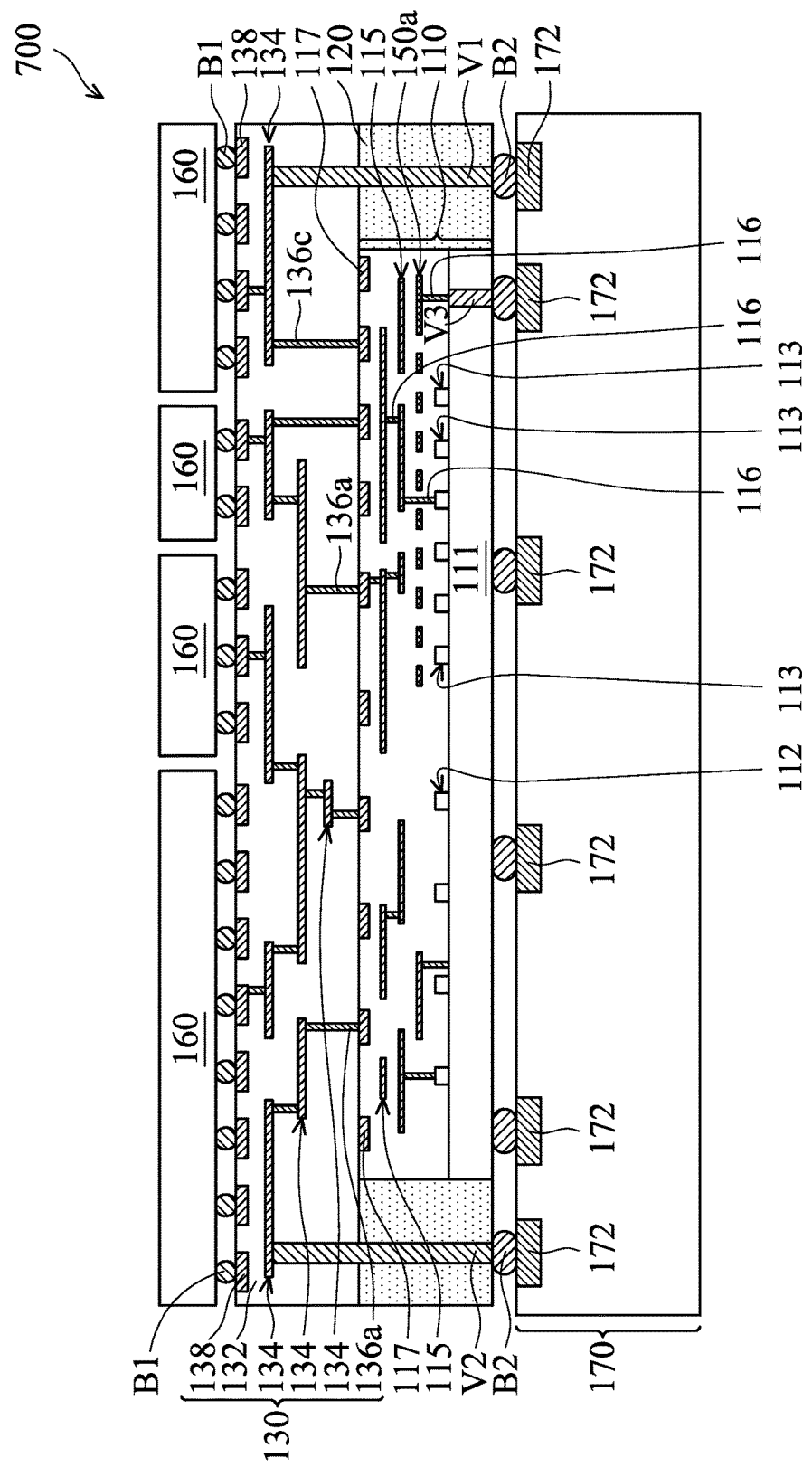
FIG. 7 is a cross-sectional view of a semiconductor device structure, in accordance with some embodiments.

FIG. 7 is a cross-sectional view of a semiconductor device structure 700, in accordance with some embodiments. It should be noted that the elements in FIG. 7, which are named and labeled identically to those in FIGS. 1A-1B and FIG. 5, have materials and structures similar thereto. Therefore, detailed descriptions are not repeated herein.

As shown in FIG. 7, the semiconductor device structure 700 is similar to the semiconductor device structure 500 of FIG. 5, except that the semiconductor device structure 700 does not include the conductive shielding layer 150 and the devices 140 of FIG. 5, in accordance with some embodiments.

The conductive shielding layer 150a reduces or eliminates coupling and interference from the devices 113 to the conductive elements thereover (e.g. the chip packages 160, the wiring layers 134 and 115, the conductive via structures 136a, 136c, and 116, the pads 138 and 117, and the conductive bumps B1), in accordance with some embodiments.

Figure 8:
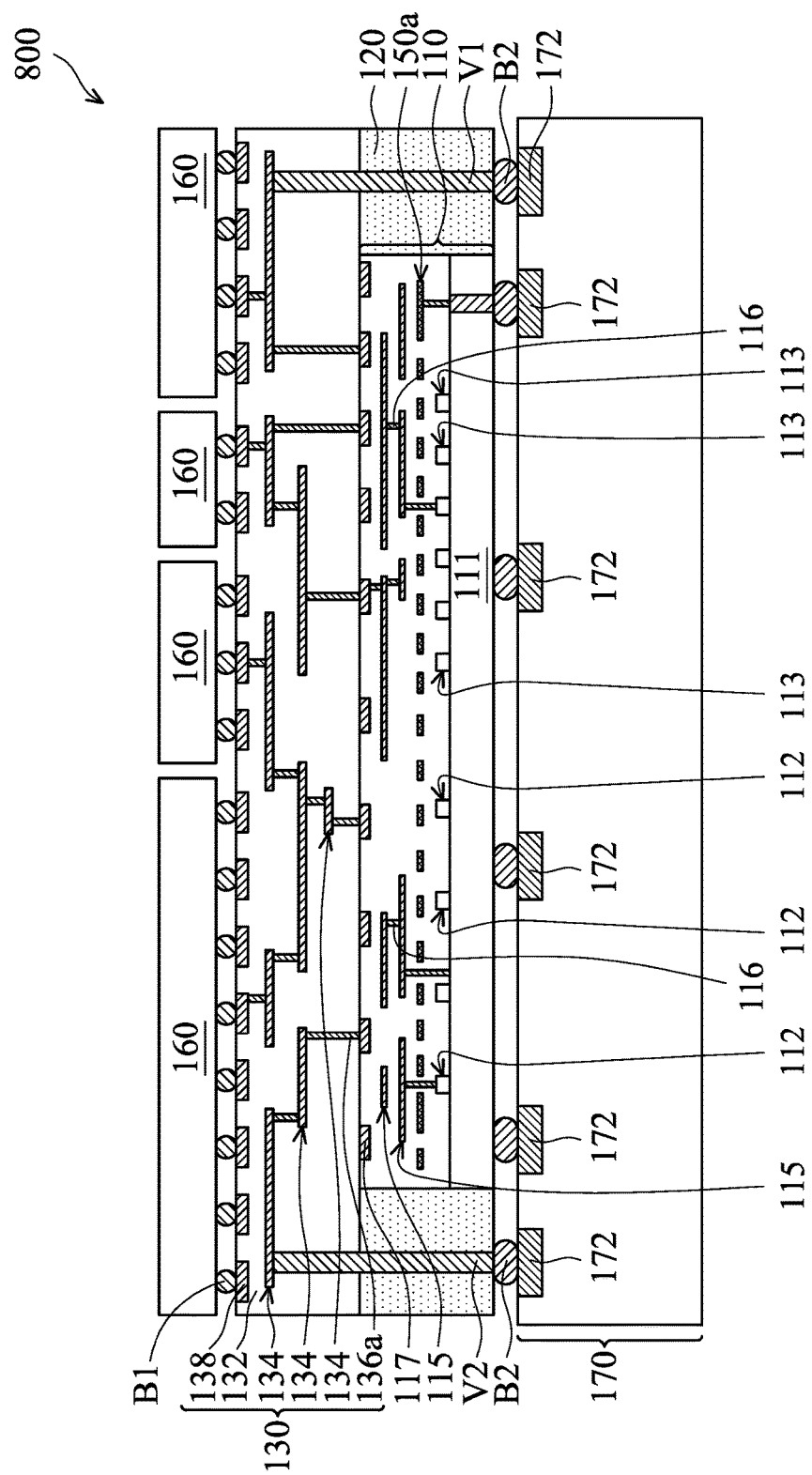
FIG. 8 is a cross-sectional view of a semiconductor device structure, in accordance with some embodiments.

FIG. 8 is a cross-sectional view of a semiconductor device structure 800, in accordance with some embodiments. It should be noted that the elements in FIG. 8, which are named and labeled identically to those in FIGS. 1A-1B and 7, have materials and structures similar thereto. Therefore, detailed descriptions are not repeated herein.

As shown in FIG. 8, the semiconductor device structure 800 is similar to the semiconductor device structure 700 of FIG. 7, except that the conductive shielding layer 150a further covers the devices 112, in accordance with some embodiments. The devices 112 are not radio frequency devices, in accordance with some embodiments.

Figure 9:
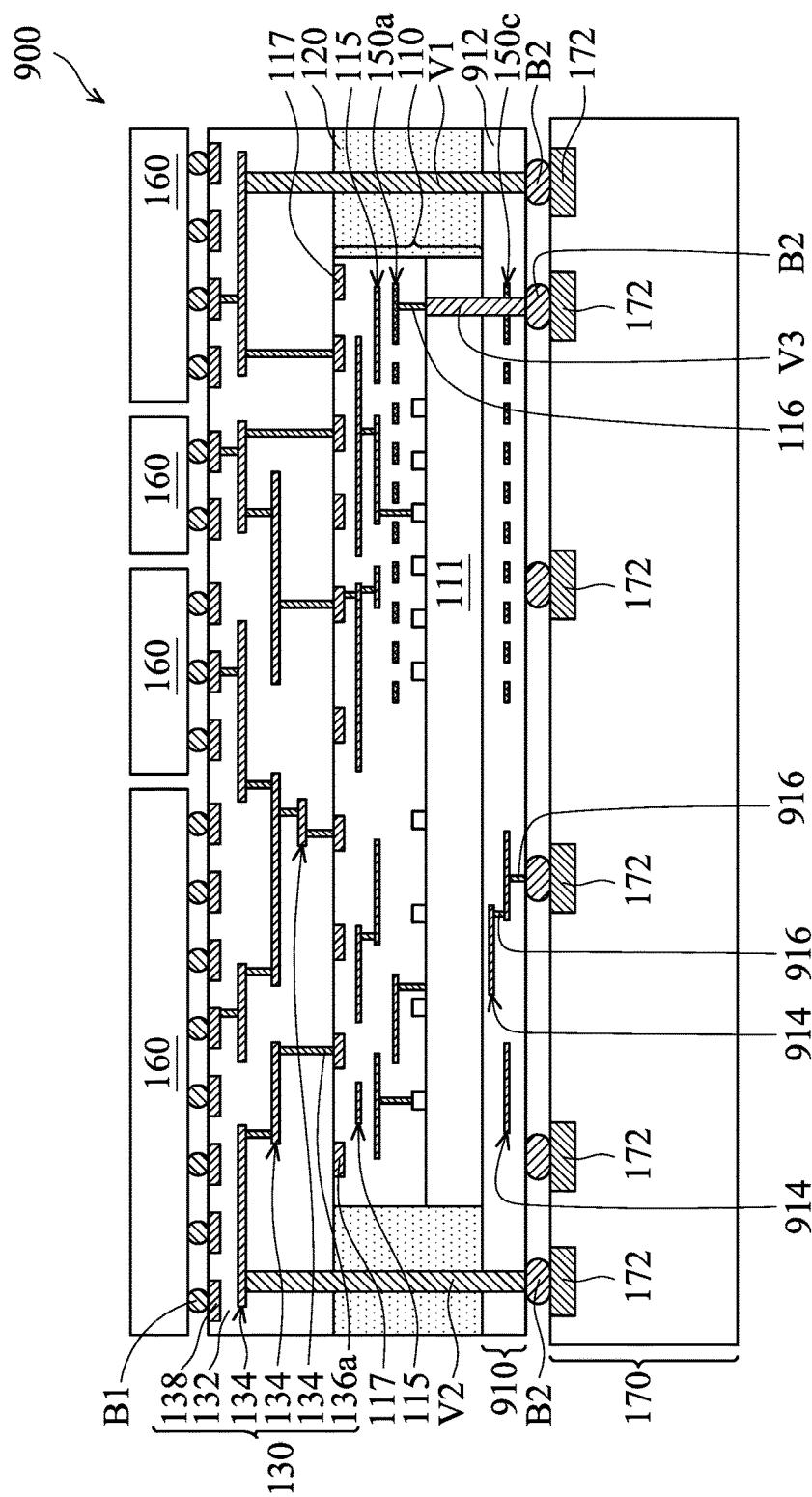
FIG. 9 is a cross-sectional view of a semiconductor device structure, in accordance with some embodiments.

FIG. 9 is a cross-sectional view of a semiconductor device structure 900, in accordance with some embodiments. It should be noted that the elements in FIG. 9, which are named and labeled identically to those in FIGS. 1A-1B and FIG. 7, have materials and structures similar thereto. Therefore, detailed descriptions are not repeated herein.

As shown in FIG. 9, the semiconductor device structure 900 is similar to the semiconductor device structure 700 of FIG. 7, except that the semiconductor device structure 900 further includes a wiring structure 910 and a conductive shielding layer 150c, in accordance with some embodiments.

The wiring structure 910 is under the chip structure 110 and the molding layer 120, in accordance with some embodiments. The wiring structure 910 includes an insulating layer 912, wiring layers 914, and conductive via structures 916, in accordance with some embodiments.

The wiring layers 914 and the conductive via structures 916 are formed in the insulating layer 912, in accordance with some embodiments. The conductive via structures 916 are between and electrically connected to the wiring layers 914 and the conductive bumps B2, in accordance with some embodiments.

The conductive shielding layer 150c is positioned in the insulating layer 912, in accordance with some embodiments. The conductive shielding layer 150c and the wiring layer 914 laterally adjacent thereto are formed by patterning the same conductive layer or performing the same damascene process, in accordance with some embodiments. Therefore, the conductive shielding layer 150c and the wiring layer 914 laterally adjacent thereto are made of the same material, in accordance with some embodiments.

The semiconductor device structure 900 further includes a conductive via structure V3, in accordance with some embodiments. The conductive via structure V3 passes through the chip 111 and the wiring structure 910, in accordance with some embodiments.

In some embodiments, the conductive shielding layers 150a and 150c are electrically connected to the pad 172, which is grounded. The conductive shielding layer 150a is grounded through the conductive via structures 116 and V3 and the conductive bump B2, in accordance with some embodiments. The conductive shielding layer 150c is grounded through the conductive via structure V3 and the conductive bump B2, in accordance with some embodiments.

Figure 10:
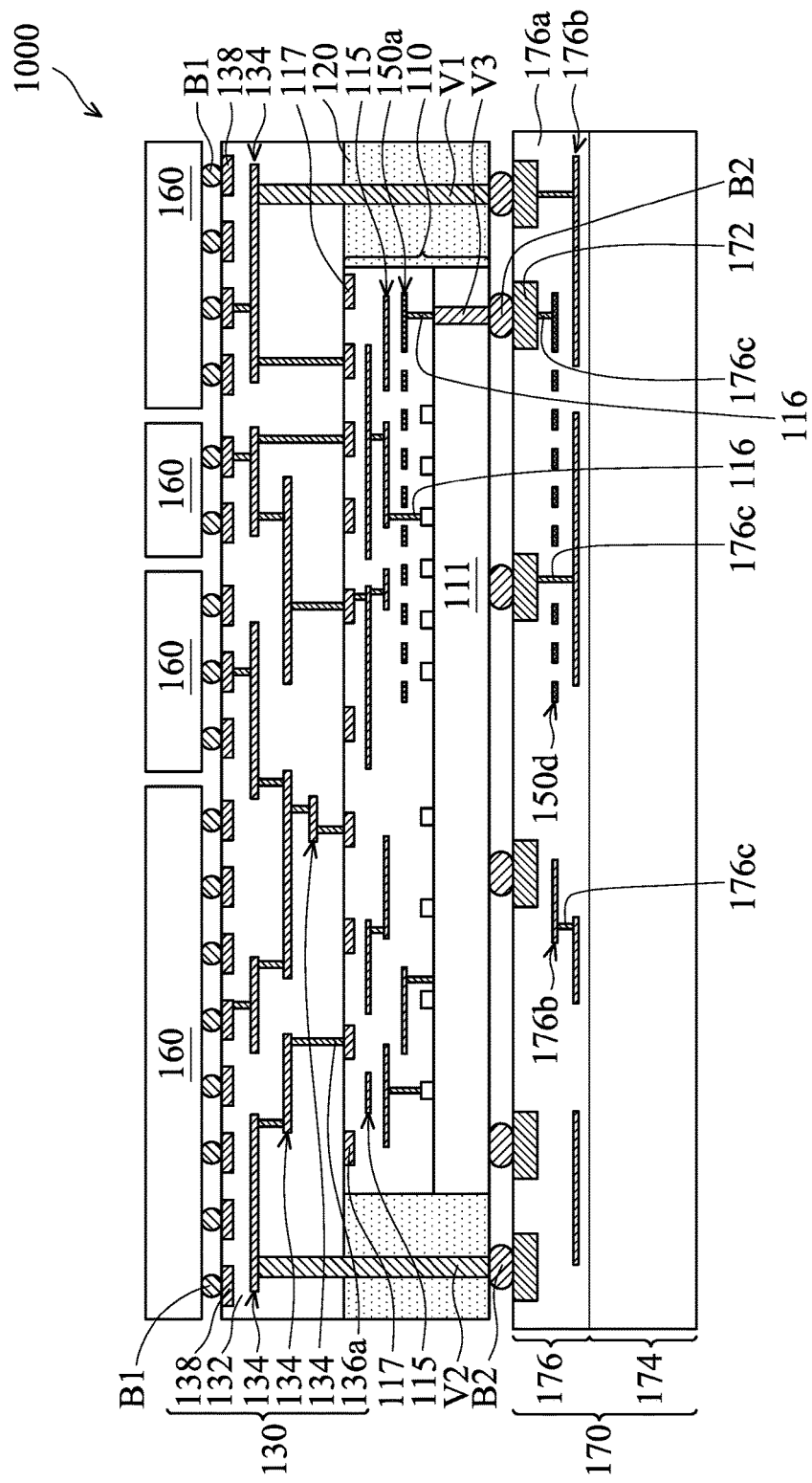
FIG. 10 is a cross-sectional view of a semiconductor device structure, in accordance with some embodiments.

FIG. 10 is a cross-sectional view of a semiconductor device structure 1000, in accordance with some embodiments. It should be noted that the elements in FIG. 10, which are named and labeled identically to those in FIGS. 1A-1B and FIG. 7, have materials and structures similar thereto. Therefore, detailed descriptions are not repeated herein.

As shown in FIG. 10, the semiconductor device structure 1000 is similar to the semiconductor device structure 700 of FIG. 7, except that the carrier substrate 170 of the semiconductor device structure 1000 includes a substrate 174, a wiring structure 176, and a conductive shielding layer 150d, in accordance with some embodiments.

The substrate 174 includes silicon, polymer, metal, or another suitable material, in accordance with some embodiments. The wiring structure 176 is over the substrate 174, in accordance with some embodiments. The wiring structure 176 includes an insulating layer 176a, wiring layers 176b, and conductive via structures 176c, in accordance with some embodiments.

The wiring layers 176b and the conductive via structures 176c are formed in the insulating layer 176a, in accordance with some embodiments. The conductive via structures 176c are between and electrically connected to the wiring layers 176b and the pads 172, in accordance with some embodiments.

The conductive shielding layer 150d is positioned in the insulating layer 176a, in accordance with some embodiments. The conductive shielding layer 150d and the wiring layer 176b laterally adjacent thereto are formed by patterning the same conductive layer or performing the same damascene process, in accordance with some embodiments.

Therefore, the conductive shielding layer 150d and the wiring layer 176b laterally adjacent thereto are made of the same material, in accordance with some embodiments. In some embodiments, the conductive shielding layers 150d is electrically connected to the pad 172, which is grounded, through the conductive via structure 176c.

Figure 11:
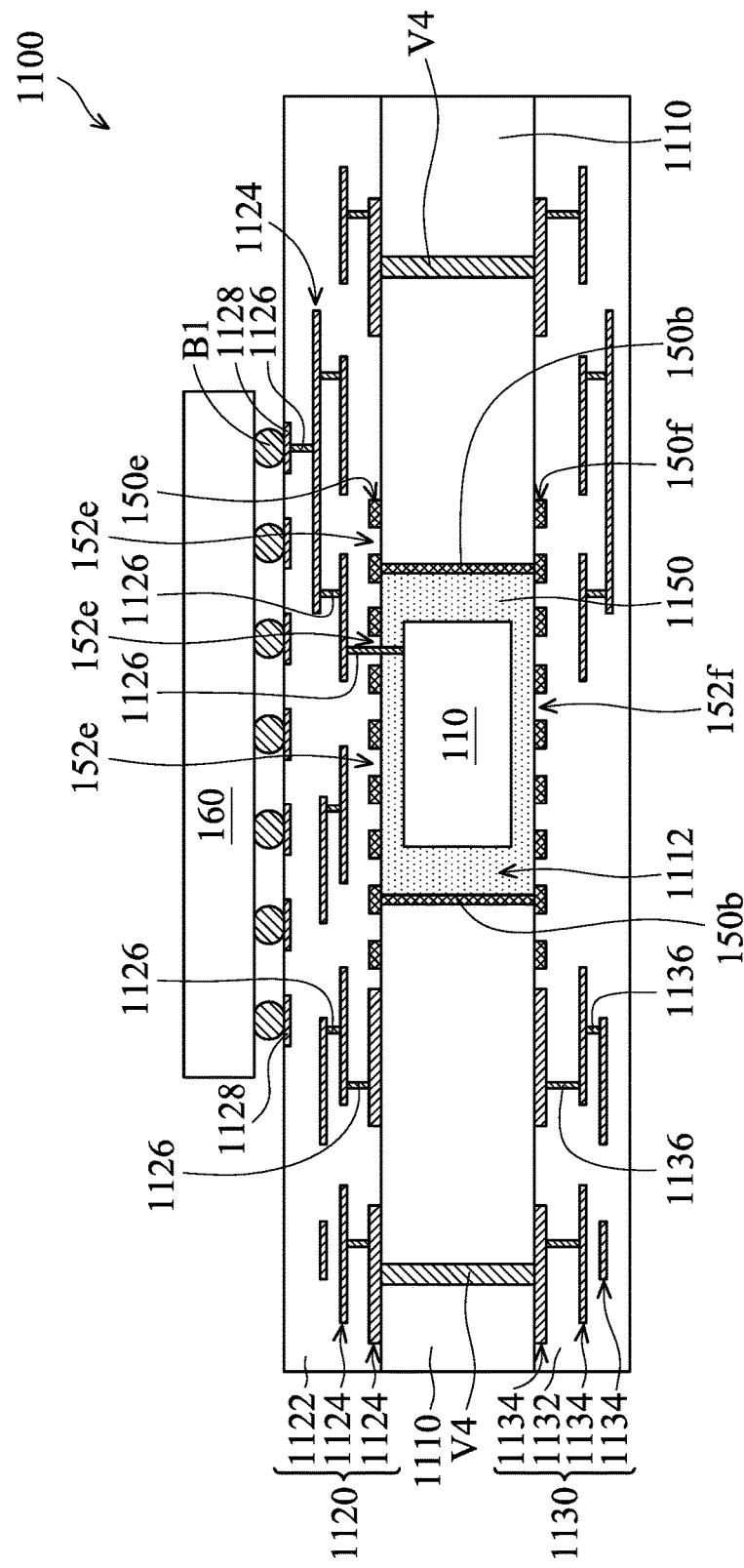
FIG. 11 is a cross-sectional view of a semiconductor device structure, in accordance with some embodiments.

FIG. 11 is a cross-sectional view of a semiconductor device structure 1100, in accordance with some embodiments. It should be noted that the elements in FIG. 11, which are named and labeled identically to those in FIGS. 1A-1B and 4A-4E, have materials and structures similar thereto. Therefore, detailed descriptions are not repeated herein.

As shown in FIG. 11, the semiconductor device structure 1100 includes a core layer 1110, wiring structures 1120 and 1130, a chip structure 110, a filling layer 1150, conductive shielding layers 150e and 150f, a chip package 160, and conductive bumps B1, in accordance with some embodiments. The core layer 1110 is also referred to as a substrate, in accordance with some embodiments. The core layer 1110 includes polymer, metal, silicon, or another suitable material, in accordance with some embodiments. In some embodiments, the core layer 1110 includes an insulating layer and wiring layers in the insulating layer (not shown).

The wiring structures 1120 and 1130 are formed over two opposite sides of the core layer 1110, in accordance with some embodiments. The wiring structure 1120 includes an insulating layer 1122, wiring layers 1124, conductive via structures 1126, and pads 1128, in accordance with some embodiments.

The wiring layers 1124 and the conductive via structures 1126 are formed in the insulating layer 1122, in accordance with some embodiments. The conductive via structures 1126 are between and electrically connected to the wiring layers 1124, the pads 172, and the chip structure 110, in accordance with some embodiments.

The core layer 1110 has an opening 1112, in accordance with some embodiments. The chip structure 110 is formed in the opening 1112, in accordance with some embodiments. The chip structure 110 is the same as the chip structure 110 of FIG. 1A, in accordance with some embodiments. The chip structure 110 includes devices 113 (as shown in FIG. 1A), in accordance with some embodiments.

The devices 113 include radio frequency devices, in accordance with some embodiments. The filling layer 1150 is filled in the opening 1112, in accordance with some embodiments. The filling layer 1150 includes an insulating material, in accordance with some embodiments.

The conductive shielding layer 150e is positioned over the filling layer 1150 and the core layer 1110 and in the insulating layer 1122, in accordance with some embodiments. The conductive shielding layer 150e has openings 152e, in accordance with some embodiments. The conductive via structures 1126 pass through the openings 152e to connect the wiring layers 1124 to the chip structure 110, in accordance with some embodiments. The maximum width of the opening 152e is less than the wavelength (or the minimum wavelength) of the energy generated by the devices 113 of the chip structure 110, in accordance with some embodiments.

The conductive shielding layer 150e and the wiring layer 1124 laterally adjacent thereto are formed by patterning the same conductive layer or performing the same damascene process, in accordance with some embodiments. Therefore, the conductive shielding layer 150e and the wiring layer 1124 laterally adjacent thereto are made of the same material, in accordance with some embodiments.

The wiring structure 1130 includes an insulating layer 1132, wiring layers 1134, and conductive via structures 1136, in accordance with some embodiments. The wiring layers 1134 and the conductive via structures 1136 are formed in the insulating layer 1132, in accordance with some embodiments. The conductive via structures 1136 are between and electrically connected to the wiring layers 1134, in accordance with some embodiments.

The conductive shielding layer 150f is positioned under the filling layer 1150 and the core layer 1110 and in the insulating layer 1132, in accordance with some embodiments. The conductive shielding layer 150f has openings 152f, in accordance with some embodiments. The maximum width of the opening 152f is less than the wavelength (or the minimum wavelength) of the energy generated by the devices 113 of the chip structure 110, in accordance with some embodiments.

The conductive shielding layer 150f and the wiring layer 1134 laterally adjacent thereto are formed by patterning the same conductive layer or performing the same damascene process, in accordance with some embodiments. Therefore, the conductive shielding layer 150f and the wiring layer 1134 laterally adjacent thereto are made of the same material, in accordance with some embodiments.

As shown in FIG. 11, the semiconductor device structure 1100 further includes a side shielding structure 150b, in accordance with some embodiments. The side shielding structure 150b is between and connected to the conductive shielding layers 150e and 150f, in accordance with some embodiments. The side shielding structure 150b surrounds the chip structure 110, in accordance with some embodiments.

The conductive shielding layers 150e and 150f and the side shielding structure 150b are similar to the conductive shielding layers 150 and 150a and the side shielding structure 150b of FIG. 4B or 4D respectively, in accordance with some embodiments.

Therefore, the side shielding structure 150b includes pillars 151b spaced apart from each other (as shown in FIG. 4B), in accordance with some embodiments. In some other embodiments, the side shielding structure 150b includes a side wall structure continuously surrounding the entire chip structure 110 (as shown in FIG. 4D).

The chip package 160 is disposed over the wiring structure 1120, in accordance with some embodiments. The conductive bumps B1 are disposed between the chip package 160 and the wiring structure 1120, in accordance with some embodiments. The chip package 160 is electrically connected to the wiring structure 1120 through the conductive bumps B1, in accordance with some embodiments.

The semiconductor device structure 1100 further includes conductive via structures V4, in accordance with some embodiments. The conductive via structures V4 pass through the core layer 1110, in accordance with some embodiments. The wiring layers 1124 are electrically connected to the wiring layers 1134 through the conductive via structures V4, in accordance with some embodiments.

The conductive shielding layers 150e and 150f and the side shielding structure 150b reduce or eliminate coupling and interference from the chip structure 110 to the conductive elements, such as the wiring structures 1120 and 1130, the chip package 160, the conductive bumps B1, and/or the conductive via structures V4, in accordance with some embodiments.

As shown in FIGS. 1A-11, the conductive shielding layers 150, 150a, 150c, 150d, 150e, and 150f have similar or the same structure, and the conductive shielding layers 150, 150a, 150c, 150d, 150e, and 150f have openings, in accordance with some embodiments. Each of the openings has a maximum width less than the wavelength (or the minimum wavelength) of the energy generated by the devices 140 and/or 113, in accordance with some embodiments.

In accordance with some embodiments, semiconductor device structures and methods for forming the same are provided. The methods (for forming the semiconductor device structure) form a conductive shielding layer between a device and a conductive element to reduce or eliminate coupling and interference from the device to the conductive element. Therefore, the performance of the semiconductor device structure is improved.

In accordance with some embodiments, a semiconductor device structure is provided. The semiconductor device structure includes a first device. The semiconductor device structure includes a conductive element over the first device. The semiconductor device structure includes a first conductive shielding layer between the first device and the conductive element. The first conductive shielding layer has openings, and a maximum width of the opening is less than a wavelength of an energy generated by the first device.

In accordance with some embodiments, a semiconductor device structure is provided. The semiconductor device structure includes a device. The semiconductor device structure includes a conductive element over the device. The semiconductor device structure includes a first conductive shielding layer between the device and the conductive element. The first conductive shielding layer has first openings. The semiconductor device structure includes a second conductive shielding layer under the device. The device is between the first conductive shielding layer and the second conductive shielding layer, and the second conductive shielding layer has second openings.

In accordance with some embodiments, a semiconductor device structure is provided. The semiconductor device structure includes a substrate having an opening. The semiconductor device structure includes a chip structure in the opening. The chip structure includes a radio frequency device. The semiconductor device structure includes a first conductive shielding layer over the opening to cover the chip structure. The first conductive shielding layer has first openings. The semiconductor device structure includes a conductive element over the substrate and the first conductive shielding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a first device;
a conductive element over the first device; and
a conductive shielding layer between the first device and the conductive element, wherein the conductive shielding layer has a plurality of openings defined there-through, and a maximum width of the opening is less than a wavelength of an energy generated by the first device.

2. The semiconductor device structure as claimed in claim 1, wherein the conductive element comprises a second device or a wiring layer.

3. The semiconductor device structure as claimed in claim 1, further comprising:
a conductive via structure electrically connected to the conductive element, wherein the conductive via structure passes through the opening, and a minimum width of the opening is greater than a width of the conductive via structure.

4. The semiconductor device structure as claimed in claim 1, further comprising:
a conductive via structure electrically connected to the first device, wherein the conductive via structure passes through the opening, and the conductive via structure is spaced apart from inner walls of the conductive shielding layer that defines the opening.

5. The semiconductor device structure as claimed in claim 1, further comprising:
a side shielding structure connected to the conductive shielding layer and surrounding the first device, wherein the side shielding structure is a conductive structure.

6. The semiconductor device structure as claimed in claim 5, wherein the side shielding structure comprises a plurality of pillars spaced apart from each other, and each of the pillars has an end portion connected to the conductive shielding layer.

7. The semiconductor device structure as claimed in claim 6, wherein a distance between two adjacent pillars is less than the wavelength.

8. The semiconductor device structure as claimed in claim 5, wherein the side shielding structure comprises a side wall structure continuously surrounding the entire first device.

9. The semiconductor device structure as claimed in claim 1, wherein the conductive shielding layer covers an entire top surface of the first device.

10. The semiconductor device structure as claimed in claim 1, wherein the conductive shielding layer is grounded.

11. A semiconductor device structure, comprising:
a chip;
a device over the chip; and
a conductive shielding layer between the chip and the device, wherein the conductive shielding layer has a plurality of openings defined there-through, and a maximum width of the opening is less than a wavelength of an energy generated by the device.

12. The semiconductor device structure as claimed in claim 11, further comprising:
a conductive via structure electrically connected to the device, wherein the conductive via structure passes through the opening, and the conductive via structure is spaced apart from inner walls of the conductive shielding layer that defines the opening.

13. The semiconductor device structure as claimed in claim 11, further comprising:
a side shielding structure connected to the conductive shielding layer and surrounding the device, wherein the side shielding structure is a conductive structure.

14. The semiconductor device structure as claimed in claim 13, wherein the side shielding structure comprises a plurality of pillars spaced apart from each other, each of the pillars has an end portion connected to the conductive shielding layer, and a distance between two adjacent pillars is less than the wavelength.

15. The semiconductor device structure as claimed in claim 11, further comprising:
a side shielding structure disposed on and connected to the conductive shielding layer and continuously surrounding the entire device, wherein the side shielding structure is a conductive structure.

16. The semiconductor device structure as claimed in claim 11, further comprising:
a molding layer surrounding side walls of the chip, wherein a portion of the conductive shielding layer is over the molding layer, and the molding layer is made of a polymer material.

17. A semiconductor device structure, comprising:
a device;
a conductive element over the device; and
a first conductive shielding layer between the device and the conductive element, wherein the first conductive shielding layer has a plurality of first openings defined there-through, a first maximum width of each of the first openings is less than a wavelength of an energy generated by the device, and one of the first openings is between the device and the conductive element.

18. The semiconductor device structure as claimed in claim 17, further comprising:
a conductive via structure electrically connecting the conductive element to the device, wherein the conductive via structure passes through the one of the first openings, and a minimum width of the one of the first openings is greater than a width of the conductive via structure.

19. The semiconductor device structure as claimed in claim 17, further comprising:

a second conductive shielding layer under the device, wherein the device is between the first conductive shielding layer and the second conductive shielding layer, and the second conductive shielding layer has a plurality of second openings defined there-through, and a second maximum width of each of the second openings is less than the wavelength.

20. The semiconductor device structure as claimed in claim 17, further comprising:
a side shielding structure in direct contact with the first conductive shielding layer and surrounding side walls of the device, wherein the side shielding structure is a conductive structure, and the first conductive shielding layer is made of a conductive material.

* * * * *